United States Patent
Minami

(10) Patent No.: US 8,937,365 B2
(45) Date of Patent: Jan. 20, 2015

(54) SEMICONDUCTOR INTEGRATED CIRCUIT DEVICE

(71) Applicant: Seiko Instruments Inc., Chiba (JP)

(72) Inventor: Yukimasa Minami, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 14/041,022

(22) Filed: Sep. 30, 2013

(65) Prior Publication Data

US 2014/0091425 A1     Apr. 3, 2014

(30) Foreign Application Priority Data

Oct. 3, 2012     (JP) ................................ 2012-221458

(51) Int. Cl.
*H01L 23/525* (2006.01)

(52) U.S. Cl.
CPC .................................. *H01L 23/5256* (2013.01)
USPC ................... 257/506; 257/209; 257/E23.149; 257/E21.591

(58) Field of Classification Search
None
See application file for complete search history.

(56) References Cited

U.S. PATENT DOCUMENTS

2003/0085445 A1 *  5/2003  Watanabe ...................... 257/529
2008/0217735 A1 *  9/2008  Chen et al. .................... 257/529

OTHER PUBLICATIONS

English Machine Translation of Hiroki Masanori (JP07-022508, Published Jan. 21, 1995), Semiconductor Integrated Circuit Device, Machine Translated Aug. 22, 2014, Patent & Utility Model Gazette DB.*
Patent Abstracts of Japan, Publication No. 05-021605, Publication Date Jan. 29, 1993.
Patent Abstracts of Japan, Publication No. 07-022508, Publication Date Jan. 24, 1995.

* cited by examiner

*Primary Examiner* — Peniel M Gumedzoe
*Assistant Examiner* — Quy Tran
(74) *Attorney, Agent, or Firm* — Adams & Wilks

(57) ABSTRACT

In a semiconductor integrated circuit device including fuse elements for performing laser trimming processing, a dummy fuse formed of a first polycrystalline Si film is formed between the fuse elements formed of a second polycrystalline Si film, and a nitride film is formed on the dummy fuse. In this manner, the step difference of an interlayer film caused by the presence and absence of the fuse element formed of the polycrystalline Si film is eliminated, to thereby prevent SOG films having moisture-absorption characteristics on an inner surface of a fuse opening region and on an internal element side from connecting to each other.

3 Claims, 6 Drawing Sheets

Sectional View along A-A'

Sectional View along B-B'

Sectional View along A-A'

Sectional View along B-B'

SEMICONDUCTOR INTEGRATED CIRCUIT DEVICE

BACKGROUND OF THE INVENTION

1. Field of the Invention

The present invention relates to a semiconductor integrated circuit device including fuse elements.

2. Description of the Related Art

Voltage regulators and voltage detectors each include an analog processing circuit, a logic circuit, a capacitor, a bleeder resistor, and the like. In the bleeder resistor, there are formed fuse elements for selecting resistors so that voltage may be adjusted to a desired one in an inspection step.

An example of such a conventional semiconductor integrated circuit device is described with reference to FIGS. 4, 5, and 6. FIG. 4 is a plan view of the fuse elements. FIG. 5 is a sectional view including a cross section taken along the line A-A' of FIG. 4 and a MOS transistor and a resistor 512 that are arranged on both sides thereof. FIG. 6 is a sectional view taken along the line B-B' of FIG. 4. As illustrated in FIG. 5, fuse elements 405 are formed on an element isolation insulating film 503, and are formed of a polycrystalline Si film doped with impurities, which is the same conductive material as a gate electrode 405a of the MOS transistor.

The polycrystalline Si films 405 are covered with an interlayer insulating film 513 and a BPSG film 514 serving as a flattening film. Contact holes 415 reaching vicinities of both end portions of the polycrystalline Si film are opened within the BPSG film 514 and the interlayer insulating film 513. On the BPSG film 514, wirings formed of a first aluminum film 416 are patterned so that the wirings are brought into contact with the polycrystalline Si film 405 through the contact hole 415 illustrated in FIG. 4. The aluminum films 416 are covered with a first metal interlayer insulating film 518 formed of TEOS as a raw material by plasma CVD.

In the conventional example, a second aluminum film (not shown) is also used in addition to the first aluminum film 416. Therefore, as a flattening film between those aluminum films, SOG films 519 are formed on the first metal interlayer insulating film 518 by rotation coating, curing, and etch-back thereafter. The SOG films 519 are covered with a second metal interlayer insulating film 520, which is formed of TEOS as a raw material by plasma CVD. The second metal interlayer insulating film 520 is covered with an SiN film 521 serving as an overcoat film formed by plasma CVD.

Besides, on the polycrystalline Si films 405, there is formed an opening region 422 for cutting with a laser beam the polycrystalline Si film 405 serving as the fuse element. The opening region 422 is formed by etching using the same mask used for etching the SiN film 521 on an aluminum pad (not shown) at the same time. However, due to over etching, the opening region 422 reaches the first metal interlayer insulating film 518. Because the fuse opening region 422 reaches the first metal interlayer insulating film 518 as described above, the SOG films 519 for flattening the surface of the first metal interlayer insulating film become a passage for moisture to enter an internal element of the semiconductor integrated circuit from the outside due to water or vapor, which has caused poor long-term reliability of the semiconductor integrated circuit device. In particular, in a PMOS transistor, a threshold voltage shift of the transistor occurs when a negative gate bias is applied, which has caused a problem of negative bias temperature instability (NBTI).

As a measure to prevent such deterioration in long-term reliability due to moisture entrance from the fuse opening region 422, there has been introduced a structure in which a seal ring 417 is formed at the outer periphery of the fuse opening region so as to form a barrier of the first aluminum film, to thereby prevent entrance of moisture inside the IC (for example, see Japanese Patent Application Laid-open Nos. Hei 05-021605 and Hei 07-022508).

However, in the seal ring 417 formed of the first aluminum film as the barrier for preventing moisture entrance from the fuse opening region 422, due to the step difference caused by presence and absence of the fuse elements 405 formed of the polycrystalline Si film as illustrated in FIGS. 5 and 6, the seal ring 417 has regions with a lower height. As a result, as illustrated in FIGS. 5 and 6, in the conventional structure, the SOG films 519 above the seal ring 417 cannot be sufficiently removed at the time of etch-back, with the result that the SOG film 519 present at the inner surface of the fuse opening region 422 and the SOG film 519 on the internal element side are connected to each other as a passage for the moisture, which may cause deterioration in characteristics of the IC.

SUMMARY OF THE INVENTION

The present invention has been made in view of the above-mentioned problem, and has an object to provide a semiconductor integrated circuit device in which flatness of an interlayer insulating film on fuse elements is improved to separate an SOG film on an inner surface of a fuse opening region from an SOG film on an internal element side, to thereby prevent moisture from entering the internal element of the semiconductor integrated circuit to improve the reliability thereof.

In order to solve the above-mentioned problem, according to one embodiment of the present invention, the following means are used.

First, there is provided a semiconductor integrated circuit device, including: a semiconductor substrate;

an element isolation insulating film formed on a surface of the semiconductor substrate;

a plurality of dummy fuses made of first polycrystalline silicon, which are arranged on the element isolation insulating film at intervals;

a silicon nitride film that covers the plurality of dummy fuses;

a fuse element made of second polycrystalline silicon, which is arranged between the plurality of dummy fuses through intermediation of the silicon nitride film;

an insulating film arranged on the fuse element and the plurality of dummy fuses;

a seal ring arranged seamlessly above the fuse element and the plurality of dummy fuses through intermediation of the insulating film;

a first wiring layer connected to the fuse element via a connection hole provided in the insulating film;

a first metal interlayer insulating film, an SOG film, and a second metal interlayer insulating film that are arranged between the first wiring layer and a second wiring layer arranged above the first wiring layer;

a protective film formed on the second metal interlayer insulating film; and an opening region formed above the fuse element by selectively removing the protective film, the opening region being provided for facilitating fuse cut.

Further, in the semiconductor integrated circuit device, the seal ring is simultaneously formed of the same material as the first wiring layer.

According to the semiconductor integrated circuit device of the one embodiment of the present invention, the dummy fuse formed of a first polycrystalline Si film is formed between the fuse elements formed of a second polycrystalline Si film, and the nitride film is formed on the dummy fuse. In this manner, the step difference (height difference) of the interlayer film caused by the presence and absence of the fuse element formed of the polycrystalline Si film is eliminated, and the SOG film above the seal ring is removed during the in-process, to thereby completely separate the SOG film on the inner surface of the fuse opening region and the SOG film on the internal element side by the seal ring. In this manner, because moisture absorbed by the SOG film is blocked by the seal ring to prevent the moisture from entering the internal element of the semiconductor integrated circuit, the reliability of the semiconductor integrated circuit may be improved.

DETAILED DESCRIPTION OF THE PREFERRED EMBODIMENT

Now, an embodiment of the present invention is described with reference to the drawings.

Figure 1:
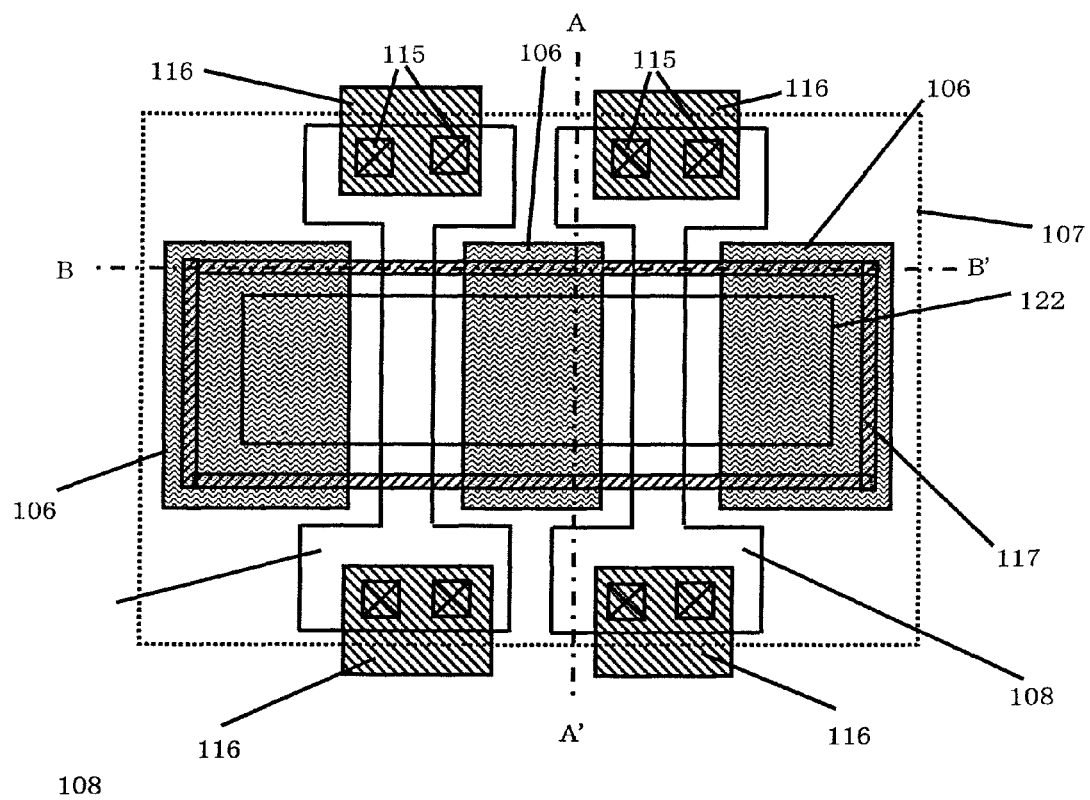
FIG. 1 is a schematic plan view of a semiconductor integrated circuit device according to a first embodiment of the present invention.
Figure 2:
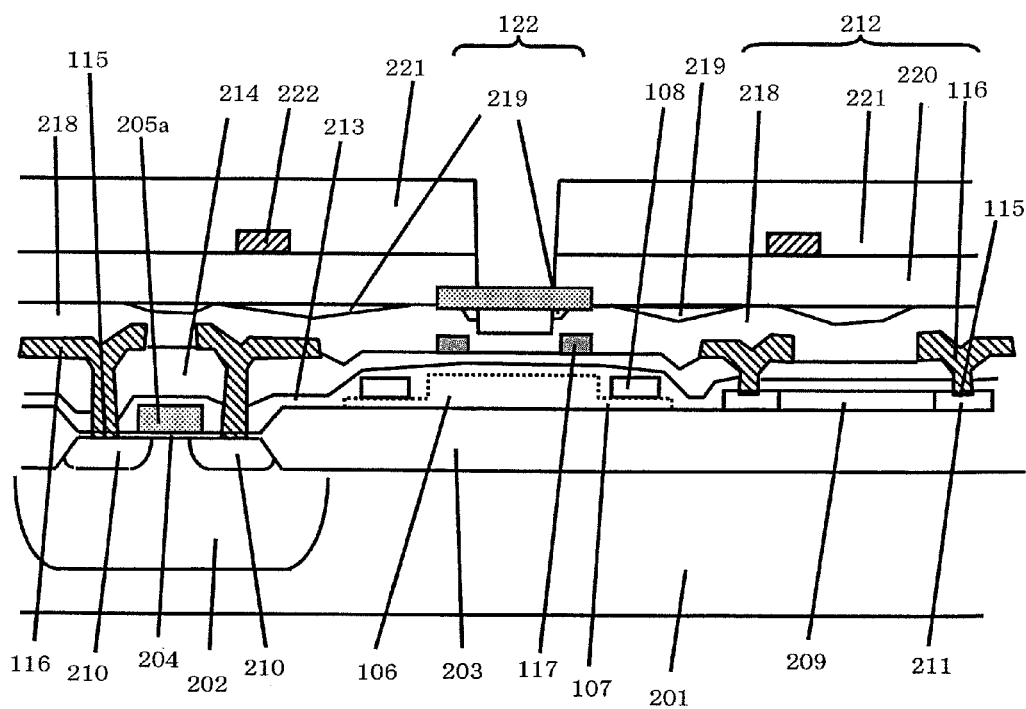
FIG. 2 is a schematic sectional view including a cross section taken along the line A-A' of the semiconductor integrated circuit device according to the first embodiment of the present invention illustrated in FIG. 1.
Figure 3:
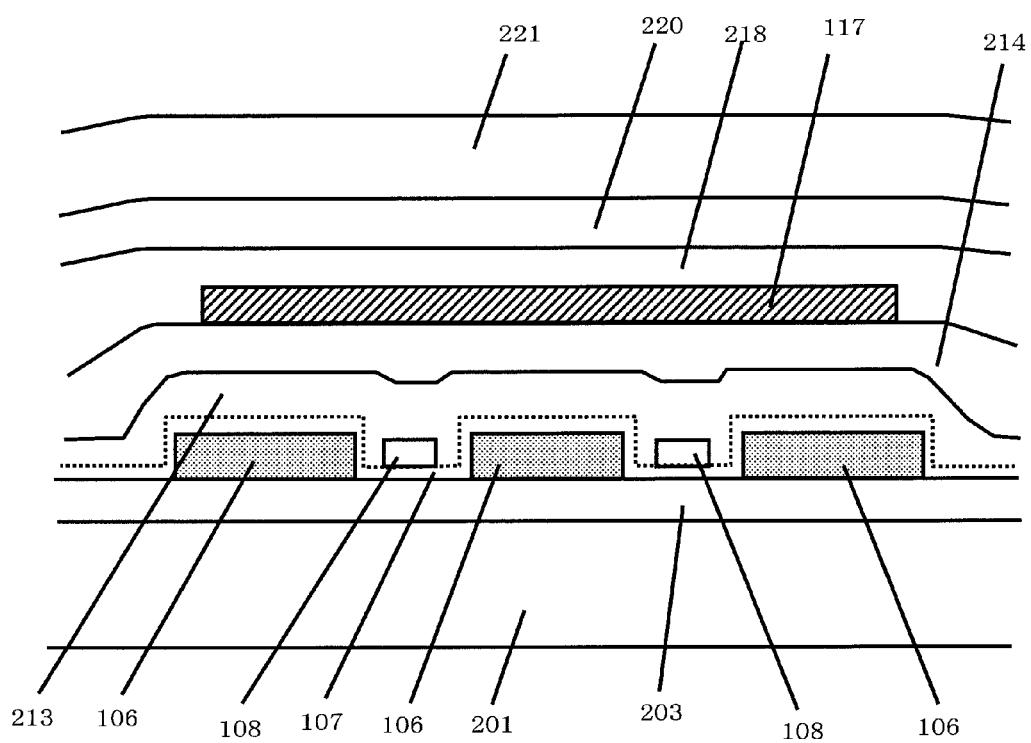
FIG. 3 is a schematic sectional view taken along the line B-B' of the semiconductor integrated circuit device according to the first embodiment of the present invention illustrated in FIG. 1.
Figure 4:
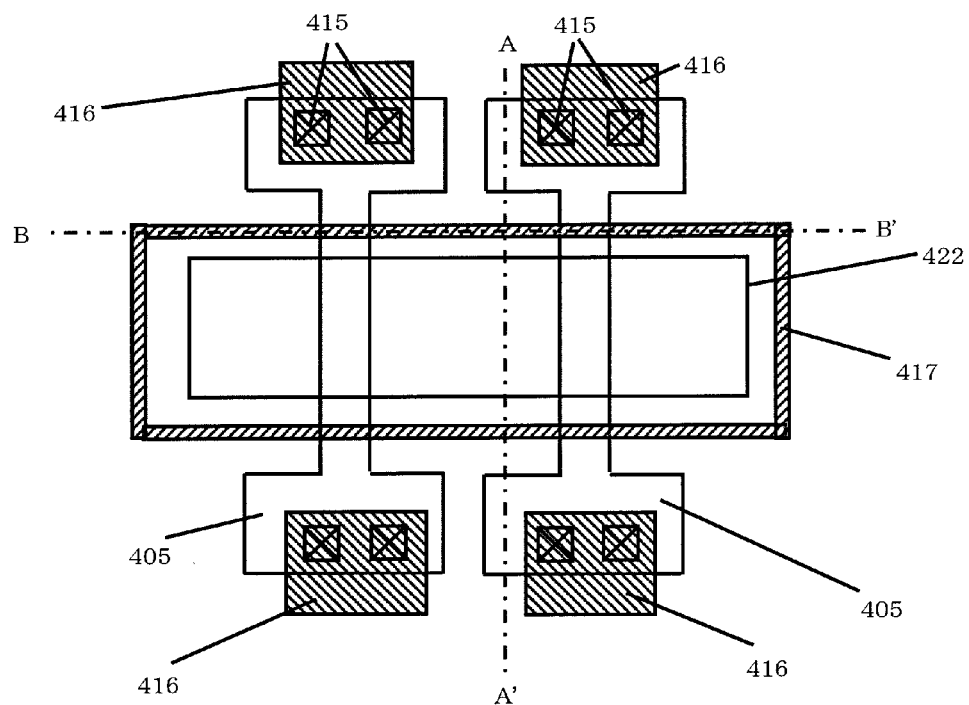
FIG. 4 is schematic plan view of a conventional semiconductor integrated circuit device.

FIG. 1 is a plan view of a semiconductor device of the present invention, and FIGS. 2 and 3 are schematic sectional views of the semiconductor device of the present invention.

With reference to FIG. 1, a planar structure of a fuse region is described. The feature of the present invention resides in that a dummy fuse 106 is arranged adjacent to a fuse element. In this case, a fuse element 108 is formed of a second polycrystalline silicon film that is the same layer as a resistor. The fuse element 108 has contact regions at both ends thereof, and first aluminum wirings 116 are formed through contact holes 115. The center portion of the fuse element 108 is thinner than both end portions thereof to facilitate laser cutting, and the dummy fuses 106 are arranged in the vicinity of both sides of the center portion of the fuse element at predetermined intervals. The dummy fuse 106 is formed of a first polycrystalline silicon film that is the same layer as a gate electrode of a transistor. The surface of the dummy fuse 106 is covered with a silicon nitride film (SiN film) 107. Then, a fuse opening region 122 is formed across the center portions of the plurality of fuse elements 108 and the dummy fuses 106. Then, a seal ring 117 formed of the first aluminum film is arranged seamlessly around the fuse opening region 122 to form a closed curve. The seal ring for flattening is arranged so as to be located above the dummy fuses to the highest possible extent. The seal ring is not arranged above the dummy fuse only in parts above the fuse elements and gaps provided on both sides of each of the fuse elements.

FIG. 2 is a sectional view including a cross section taken along the line A-A' of FIG. 1 and a MOS transistor and a resistor 212 arranged on both sides thereof. The dummy fuse 106 covered with the silicon nitride film 107 is arranged below the fuse opening region 122.

Next, the structure of such a semiconductor integrated circuit device is described based on the manufacturing method therefore. On a P-type silicon semiconductor substrate 201, there are formed an N-type well diffusion layer 202 formed in a PMOS transistor region, and a P-type well diffusion layer (particularly not shown) formed in an NMOS transistor region. An element isolation insulating film 203 that is an oxide film is formed by LOCOS at, for example, about 4,000 Å to 8,000 Å.

Then, a gate insulating film 204 is formed by thermal oxidation at about 100 Å to 400 Å. After ion implantation is performed so as to obtain a desired threshold voltage, a first polycrystalline Si film that becomes the gate electrode is deposited by CVD. The first polycrystalline Si film is patterned with use of a photoresist to form a gate electrode 205a and the dummy fuse 106 in a fuse element forming region. At this time, in the first polycrystalline Si film that becomes the gate electrode 205a and the dummy fuse 106, phosphorus or boron is diffused by ion implantation or doped-CVD so that the polycrystalline Si film has an electrode polarity of an N type or P type in advance. After that, the first SiN film 107 is formed on the first polycrystalline Si film by LPCVD. As described above, by covering the dummy fuse 106 formed of the first polycrystalline Si film with the SiN film 107, when the fuse elements for adjusting the characteristics of the IC are subjected to laser trimming, there is an effect of preventing the fuse elements from being short-circuited. Note that, the SiN film formed in a region other than the fuse element region may be removed or left as it is. After that, in order to form the resistor and the fuse element, a second polycrystalline silicon film is deposited, and low-concentration impurities are doped. Any one of a P-type resistor and an N-type resistor is formed depending on the purpose of use. Further, the second polycrystalline silicon film may be formed by doped-CVD. After that, after a photolithography step, the second polycrystalline silicon film is etched to form a pattern, and thus the high-resistance resistor 212 and the fuse element 108 are formed.

After that, there are formed P-type high concentration impurity regions 210 that become a drain and a source of the PMOS transistor, and N-type high concentration impurity regions (particularly not shown) that become a source and a drain of the NMOS transistor. Further, at the same time, in order to reduce the resistance at a contact part of the resistor 212 and the resistance of the fuse element 108, ion implantation of P-type or N-type high concentration impurities is simultaneously performed to contact portions 211 arranged on both sides of a low concentration region 209 of the resistor and the entire fuse element to sufficiently increase the impurity concentration.

After that, an interlayer insulating film 213 and an insulating BPSG film 214 serving as a flattening film are formed, and then the first contact holes 115 are opened. On the BPSG film 214, wiring formed of the first aluminum film 116 is patterned so as to be brought into contact with respective elements through the contact holes 115. Further, the first aluminum film 116 is patterned as the seal ring 117 for preventing moisture entrance between the fuse elements 108 and the opening region 122 for fuse trimming, which is to be formed in the subsequent step.

After that, for multi-layer wiring, a first metal interlayer insulating film 218 is formed of TEOS by P-CVD, for example. In order to enhance the flatness, SOG films 219 are formed on the first metal interlayer insulating film 218 by rotation coating, curing, and etch-back. As a result, the SOG films 219 hardly remain and the surface of the first metal interlayer insulating film 218 is exposed in a flattened state. Further, on the first metal interlayer insulating film 218, a second metal interlayer insulating film 220 is formed of TEOS as a raw material by plasma CVD. After that, second contact holes (not shown) are formed, and a second aluminum film 222 is formed. After that, a second SiN film 221 serving as a protective film is formed by plasma CVD so as to cover the second aluminum film and the second metal interlayer insulating film 220. Then, in the second SiN film 221 serving as the protective film, the opening region 122 for an aluminum pad (not shown) or for trimming processing is selectively provided by etching.

Figure 5:
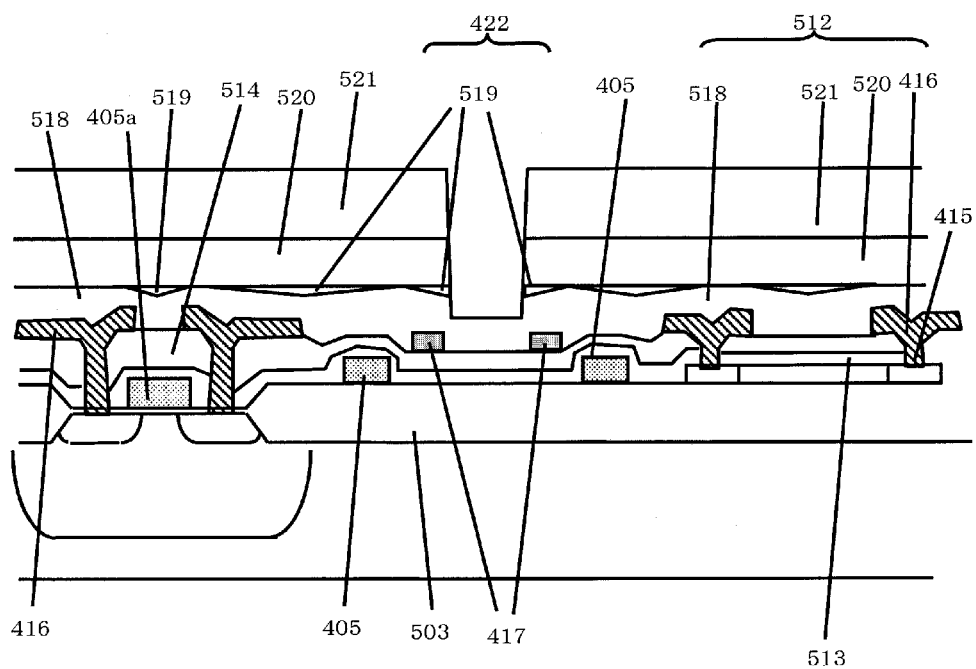
FIG. 5 is a schematic sectional view taken along the A-A' line of the conventional semiconductor integrated circuit device illustrated in FIG. 4.
Figure 6:
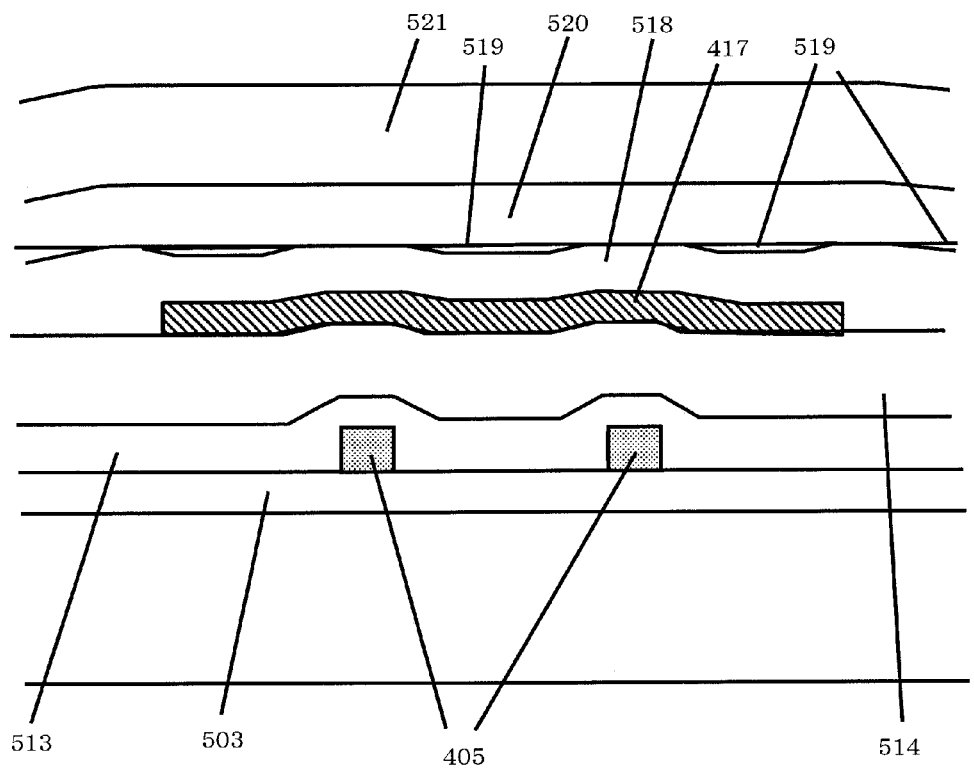
FIG. 6 is a schematic sectional view taken along the B-B' line of the conventional semiconductor integrated circuit device illustrated in FIG. 4.

FIG. 3 is a sectional view taken along the line B-B' of FIG. 1. As the structure of the present invention illustrated in FIGS. 2 and 3, between the adjacent fuse elements 108 formed of the second polycrystalline Si film, the dummy fuse 106 formed of the first polycrystalline Si film covered with the first SiN film 107 is provided, to thereby reduce the step difference so that the flatness of the interlayer insulating film 213 and the BPSG film 214 is dramatically improved as compared to the case where no dummy fuse is provided. With this, because it is possible to neglect the influence of the step difference caused by the presence and absence of the fuse element unlike the conventional structure of FIGS. 5 and 6, no gap for entrance of the SOG film 219 is formed above the seal ring. As a result, by the etch-back step that is a flattening technology during the in-process, the SOG film 219 above the seal ring 117 is sufficiently removed, and the SOG film 219 is sufficiently cut and interrupted by the seal ring 117. As a result, because moisture does not enter the internal element of the semiconductor integrated circuit device via the SOG film, the reliability of the semiconductor integrated circuit device can be improved. Note that, when the SOG film can be interrupted by the seal ring so that the SOG film does not become the moisture passage from the inner surface of the fuse opening region, the SOG film may be formed in a space between the aluminum wirings in the internal element region.

In the semiconductor integrated circuit device of the present invention formed as described above, because the SOG film having moisture-absorption characteristics above the seal ring is completely removed, moisture is prevented from entering the internal element from the opening region, and thus the reliability of the semiconductor integrated circuit can be improved.

What is claimed is:

1. A semiconductor integrated circuit device, comprising:
   a semiconductor substrate;
   an element isolation insulating film formed on a surface of the semiconductor substrate;
   a plurality of dummy fuses made of first polycrystalline silicon, and arranged on the element isolation insulating film at intervals;
   a silicon nitride film that covers the plurality of dummy fuses;
   a fuse element made of second polycrystalline silicon arranged between the plurality of dummy fuses through intermediation of the silicon nitride film;
   an insulating film arranged on the fuse element and the plurality of dummy fuses;
   a seal ring arranged seamlessly above the fuse element and the plurality of dummy fuses through intermediation of the insulating film;
   a first wiring layer connected to the fuse element via a connection hole provided in the insulating film;
   a first metal interlayer insulating film, an SOG film, and a second metal interlayer insulating film that are arranged between the first wiring layer and a second wiring layer arranged above the first wiring layer;
   a protective film formed on the second metal interlayer insulating film; and
   an opening region formed above the fuse element by selectively removing the protective film, the opening region being provided for facilitating fuse cut.

2. A semiconductor integrated circuit device according to claim 1, wherein the seal ring is simultaneously formed of the same material as the first wiring layer.

3. A semiconductor integrated circuit device according to claim 1, wherein the insulating film under the seal ring is flattened.

* * * * *